(12) United States Patent
Cuevas et al.

(10) Patent No.: US 8,214,186 B2
(45) Date of Patent: Jul. 3, 2012

(54) OILFIELD EMULATOR

(75) Inventors: Francisco Villanueva Cuevas, Merida (MX); Edgar Mauricio Cadena Parga, Macae (BR); Gustavo Ariel Marin, Quito (EC)

(73) Assignee: Schlumberger Technology Corporation, Sugar Land, TX (US)

( * ) Notice: Subject to any disclaimer, the term of this patent is extended or adjusted under 35 U.S.C. 154(b) by 716 days.

(21) Appl. No.: 12/361,694

(22) Filed: Jan. 29, 2009

(65) Prior Publication Data
US 2009/0198478 A1    Aug. 6, 2009

Related U.S. Application Data

(60) Provisional application No. 61/026,101, filed on Feb. 4, 2008.

(51) Int. Cl.
| G06G 7/58 | (2006.01) |
| G06G 7/50 | (2006.01) |
| E21B 43/00 | (2006.01) |
| E21B 47/00 | (2012.01) |

(52) U.S. Cl. ......... 703/10; 703/9; 166/372; 166/250.01
(58) Field of Classification Search ............... 703/9–10; 700/28–32; 166/250.15, 250.01, 372
See application file for complete search history.

(56) References Cited

U.S. PATENT DOCUMENTS

| 5,871,048 | A  * | 2/1999 | Tokar et al. ................... 166/372 |
| 6,182,756 | B1 * | 2/2001 | Garcia et al. ................... 166/372 |
| 6,236,894 | B1 * | 5/2001 | Stoisits et al. ................... 700/28 |
| 6,694,196 | B2 * | 2/2004 | Tuttle et al. ..................... 700/28 |
| 7,114,557 | B2 * | 10/2006 | Cudmore et al. ................ 166/52 |
| 2002/0029883 | A1 * | 3/2002 | Vinegar et al. ........... 166/250.15 |
| 2005/0173114 | A1 * | 8/2005 | Cudmore et al. ........ 166/250.15 |
| 2005/0199391 | A1 * | 9/2005 | Cudmore et al. ........ 166/250.15 |
| 2005/0267718 | A1 * | 12/2005 | Guyaguler et al. ............. 703/10 |
| 2007/0016389 | A1 * | 1/2007 | Ozgen ............................ 703/10 |
| 2008/0133194 | A1 | 6/2008 | Klumpen et al. |
| 2008/0140369 | A1 | 6/2008 | Rashid et al. |
| 2008/0162248 | A1 * | 7/2008 | Vachon et al. ..................... 705/9 |
| 2008/0234939 | A1 * | 9/2008 | Foot et al. ....................... 702/12 |
| 2008/0262735 | A1 * | 10/2008 | Thigpen et al. ................... 702/6 |
| 2008/0262736 | A1 * | 10/2008 | Thigpen et al. ................... 702/9 |
| 2009/0012765 | A1 * | 1/2009 | Raphael ........................ 703/10 |
| 2009/0198478 | A1 * | 8/2009 | Cuevas et al. ................... 703/10 |
| 2010/0174517 | A1 * | 7/2010 | Slupphaug et al. ............. 703/10 |
| 2011/0118882 | A1 * | 5/2011 | Carlson et al. ................ 700/282 |

OTHER PUBLICATIONS

Simulation and Optimization of Continuous Gas Lift System in Aghajari Oil Field; Alireza Bahadori et al pp. 1-6 SPE 2001.*

* cited by examiner

*Primary Examiner* — Kamini S Shah
*Assistant Examiner* — Akash Saxena
(74) *Attorney, Agent, or Firm* — Colin L. Wier

(57) ABSTRACT

A method for performing oilfield operations for an oilfield. The method includes receiving modeling data and user instructions from a graphical user interface, selectively adjusting at least a portion of the modeling data to generate adjusted modeling data, obtaining an oilfield model based on the user instructions, instantiating first and second simulator instances based on the user instructions for performing a simulation using the adjusted modeling data and the oilfield model, passing interim simulation results between the first and second simulator instances for performing the simulation, displaying a result of the simulation using the graphical user interface, and performing the oilfield operations based on the result of the simulation. Further, the oilfield operations include a gas lift operation of the oilfield and the graphical user interface is configured to emulate the gas lift operation using a wellbore simulator.

20 Claims, 7 Drawing Sheets

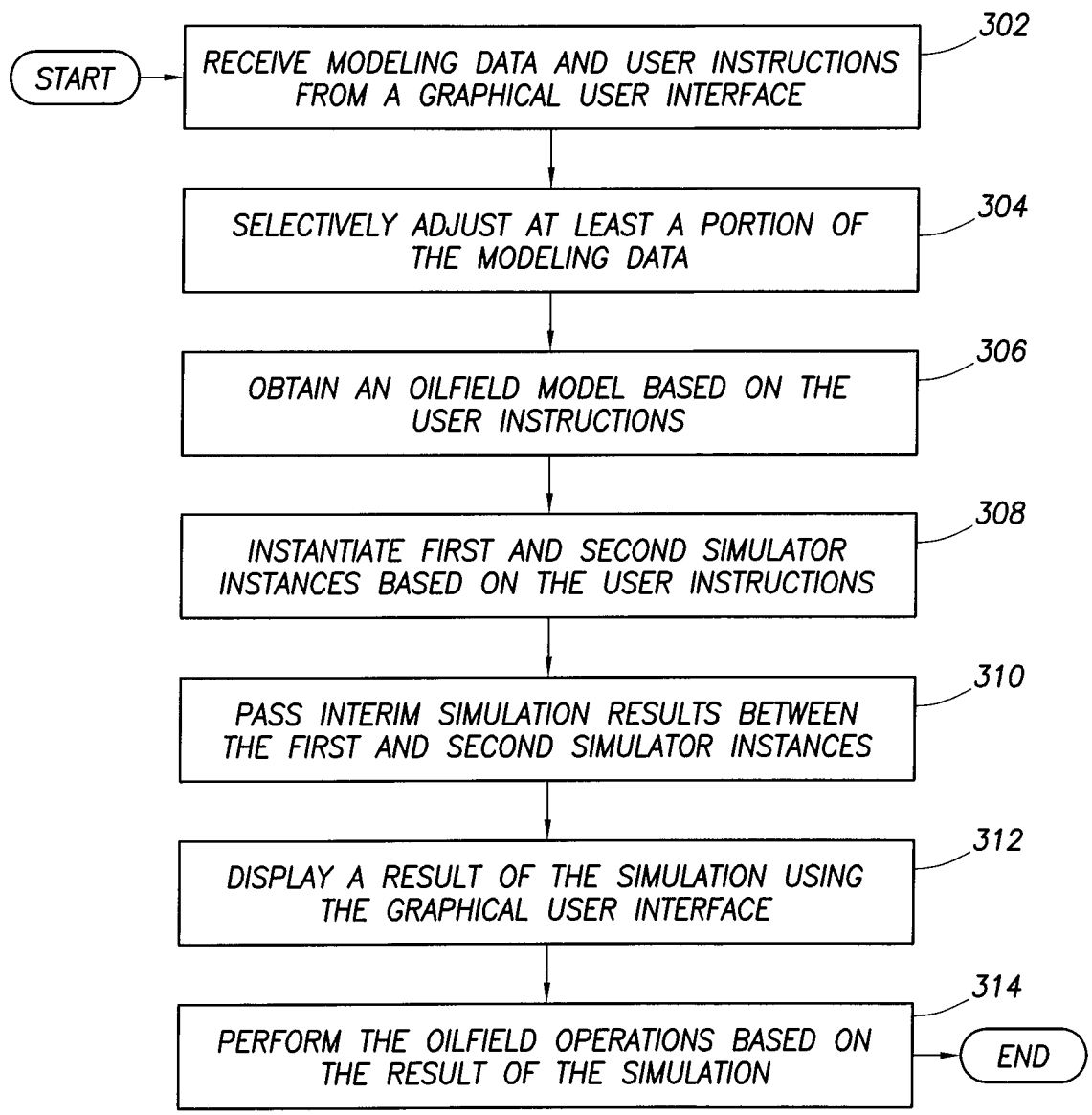
FIG.3
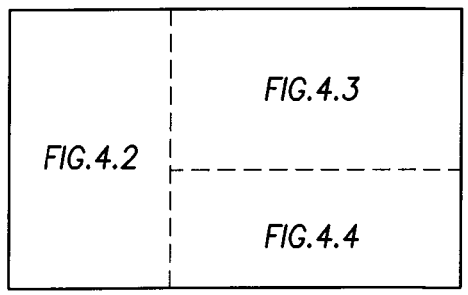
FIG.4.1

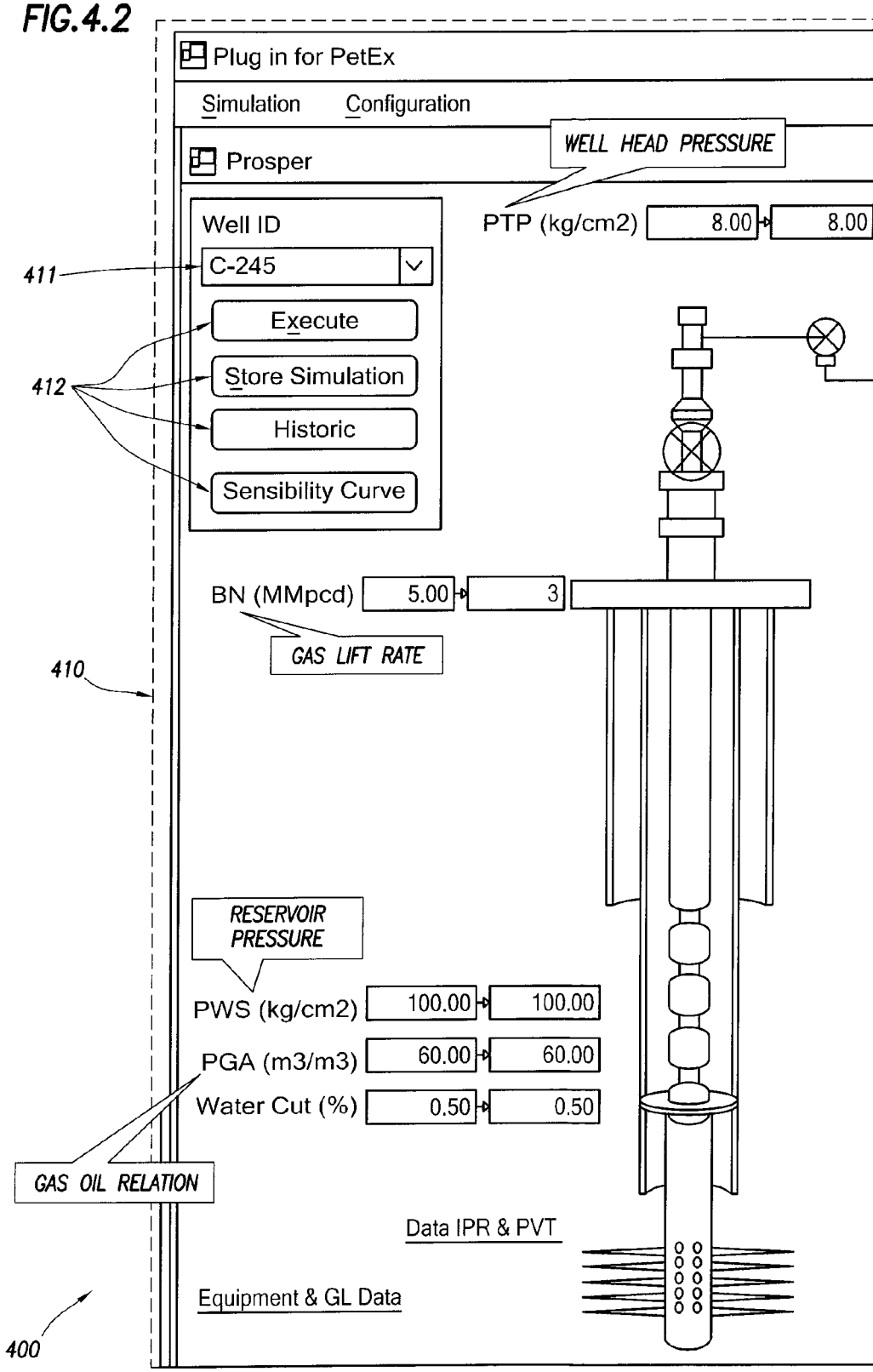
FIG.4.2

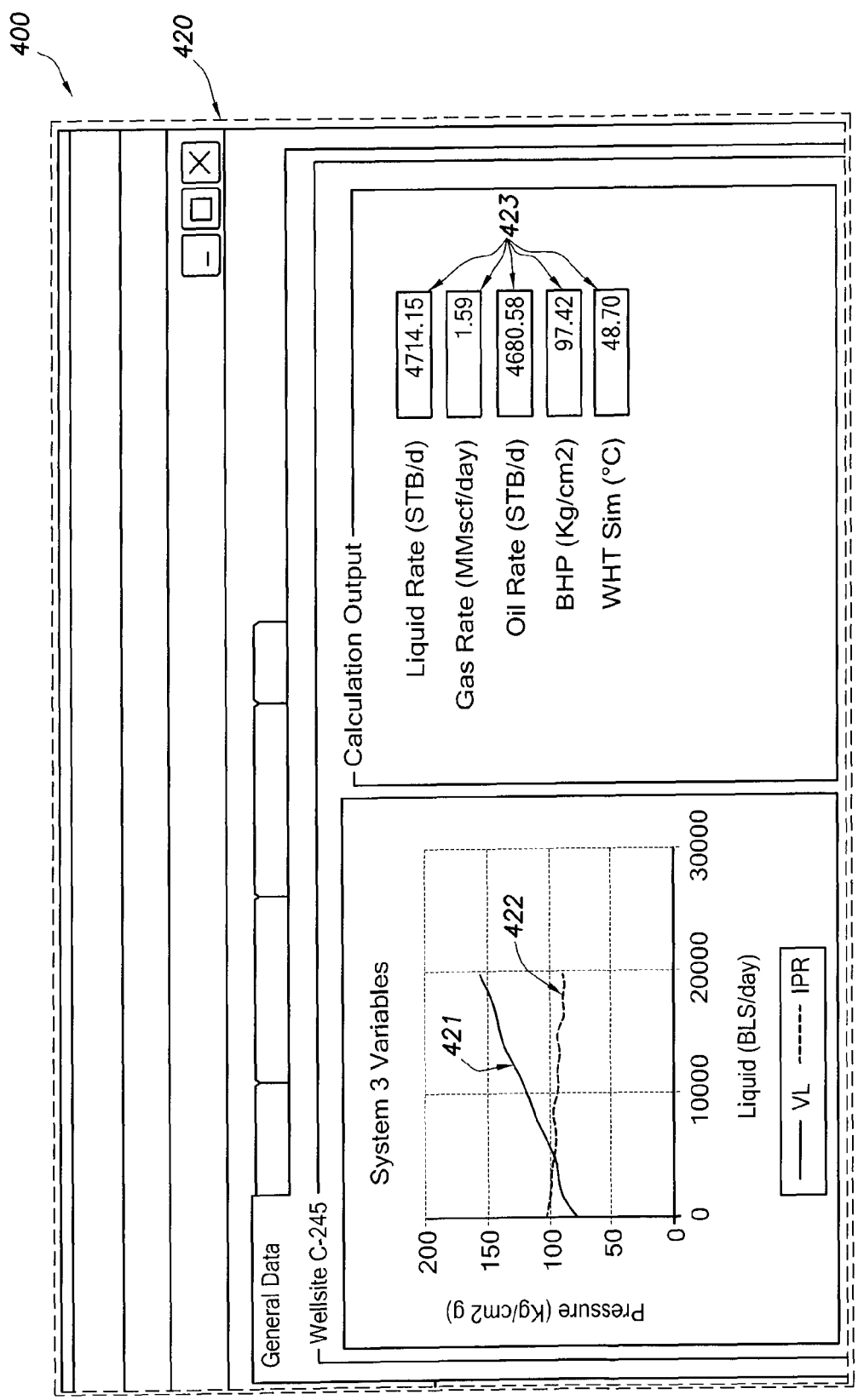
FIG.4.3

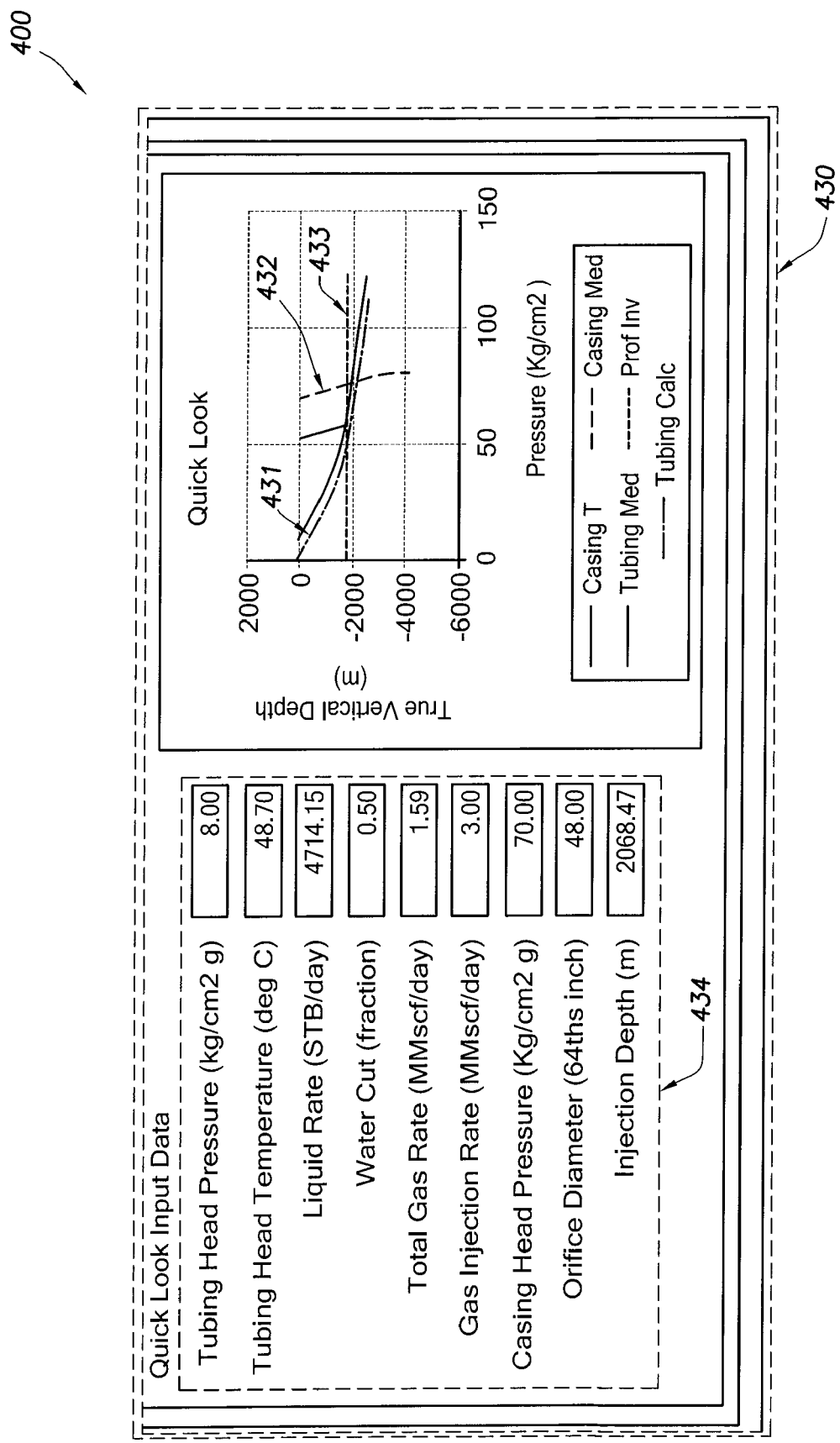
FIG.4.4

OILFIELD EMULATOR

CROSS REFERENCE TO RELATED APPLICATIONS

This application claims priority under 35 U.S.C. §119(e) from Provisional Patent Application No. 61/026,101 filed Feb. 4, 2008, entitled "Method and Apparatus for Flow Rate Estimate Using Well Models and Gas Lift Optimization", which is hereby incorporated by reference in its entirety.

BACKGROUND

The following descriptions and examples do not constitute an admission as prior art by virtue of their inclusion within this section.

Oilfield operations, such as surveying, drilling, wireline testing, completions, production, planning and oilfield analysis, are typically performed to locate and gather valuable downhole fluids. During the oilfield operations, data is typically collected for analysis and/or monitoring of the oilfield operations. Such data may include, for example, subterranean formation, equipment, historical and/or other data. Such formation data may be static or dynamic. Static data relates to, for example, formation structure and geological stratigraphy that define geological structures of the subterranean formation. Dynamic data relates to, for example, fluids flowing through the geologic structures of the subterranean formation over time. Such static and/or dynamic data may be collected to learn more about the formations and the valuable assets contained therein.

Sensors may be positioned about the oilfield to collect data relating to various oilfield operations. For example, sensors in the drilling equipment may monitor drilling conditions, sensors in the wellbore may monitor fluid composition, sensors located along the flow path may monitor flow rates and sensors at the processing facility may monitor fluids collected. Other sensors may be provided to monitor downhole, surface, equipment or other conditions. Such conditions may relate to the type of equipment at the wellsite, the operating setup, formation parameters or other variables of the oilfield. The monitored data is often used to make decisions at various locations of the oilfield at various times. Data collected by these sensors may be further analyzed and processed. Data may be collected and used for current or future operations. When used for future operations at the same or other locations, such data may sometimes be referred to as historical data.

The data may be used to predict downhole conditions, and make decisions concerning oilfield operations. Such decisions may involve well planning, well targeting, well completions, operating levels, production rates and other operations and/or operating parameters. Often this information is used to determine when to drill new wells, re-complete existing wells or alter wellbore production. Oilfield conditions, such as geological, geophysical, and reservoir engineering characteristics, may have an impact on oilfield operations, such as risk analysis, economic valuation, and mechanical considerations for the production of subsurface reservoirs. Data from one or more wellbores may be analyzed to plan or predict various outcomes at a given wellbore. In some cases, the data from neighboring wellbores, or wellbores with similar conditions or equipment, may be used to predict how a well will perform. There are usually a large number of variables and large quantities of data to consider in analyzing oilfield operations. It is, therefore, often useful to model the behavior of the oilfield operation to determine a desired course of action. During the ongoing operations, the operating parameters may be adjusted as oilfield conditions change and new information is received.

Techniques have been developed to enhance the production of oilfield from subterranean formations. One such technique involves the use of gas-lifted wells. Gas lift is an artificial-lift method in which gas is injected into the production tubing to reduce the hydrostatic pressure of the fluid column. The resulting reduction in bottomhole pressure allows the reservoir liquids to enter the wellbore at a higher flowrate. The injection gas is typically conveyed down the tubing-casing annulus and enters the production train through a series of gas lift valves. Various parameters for performing the gas lift operation (i.e., lift configuration), such as gas lift valve position, operating pressures and gas injection rate, may be determined by specific well conditions. The injected gas (or lift gas) is provided to reduce the bottom-hole pressure and allow more oil to flow into the wellbore. While the discussion below refers to lift gas, one skilled in the art will appreciate that any resource (e.g., gas, energy for electrical submersible pump (ESP) lifted well, stimulation agents such as methanol, choke orifice size, etc.) may be used to provide or enhance lift.

There are many factors to consider in designing a gas lift operation. The optimal conditions for performing a gas lift operation may depend on a variety of factors, such as the amount of lift gas to inject, inflow performance, equipment (e.g. tubing), surface hydraulics, operating constraints, cost, handling capacities, compression requirements and the availability of lift gas. Moreover, a gas lift well network (i.e., a network including gathering network and at least one gas lift well) may be constrained by the amount of gas available for injection or at other times the total amount of produced gas permissible during production due to separator constraints. Under either of these constraints, engineers may allocate the lift gas amongst the wells so as to maximize the oil production rate. This is an example of a real world scenario that can be modeled in network simulators. For example, a gathering network model may be used to allocate the amount of lift gas to inject into each well based on static boundary conditions at the reservoir and processing facility. Other methods of increasing production in oilfields may involve allocation of electrical power to electrical submersible pump (ESP) lifted wells or allocation of chemicals to wells stimulated by chemical injection, etc. Throughout this document, the use of the term "lift gas" or "gas lift" should include any possible resource that could provide lift and not be limited to merely include the use of gas.

SUMMARY

In general, in one aspect, the invention relates to a method for performing oilfield operations for an oilfield. The method includes receiving modeling data and user instructions from a graphical user interface, selectively adjusting at least a portion of the modeling data to generate adjusted modeling data, obtaining an oilfield model based on the user instructions, instantiating first and second simulator instances based on the user instructions for performing a simulation using the adjusted modeling data and the oilfield model, passing interim simulation results between the first and second simulator instances for performing the simulation, displaying a result of the simulation using the graphical user interface, and performing the oilfield operations based on the result of the simulation, wherein the oilfield operations comprise a gas lift operation of the oilfield and the graphical user interface is configured to emulate the gas lift operation using a wellbore simulator.

Other aspects of the oilfield emulator will be apparent from the following description and the appended claims.

BRIEF DESCRIPTION OF DRAWINGS

FIG. 3 shows a flowchart depicting a method for performing the oilfield operation in accordance with one or more embodiments of the oilfield emulator.

FIG. 4 shows an example screen shot in accordance with one or more embodiments of the oilfield emulator.

DETAILED DESCRIPTION

Figure 1:
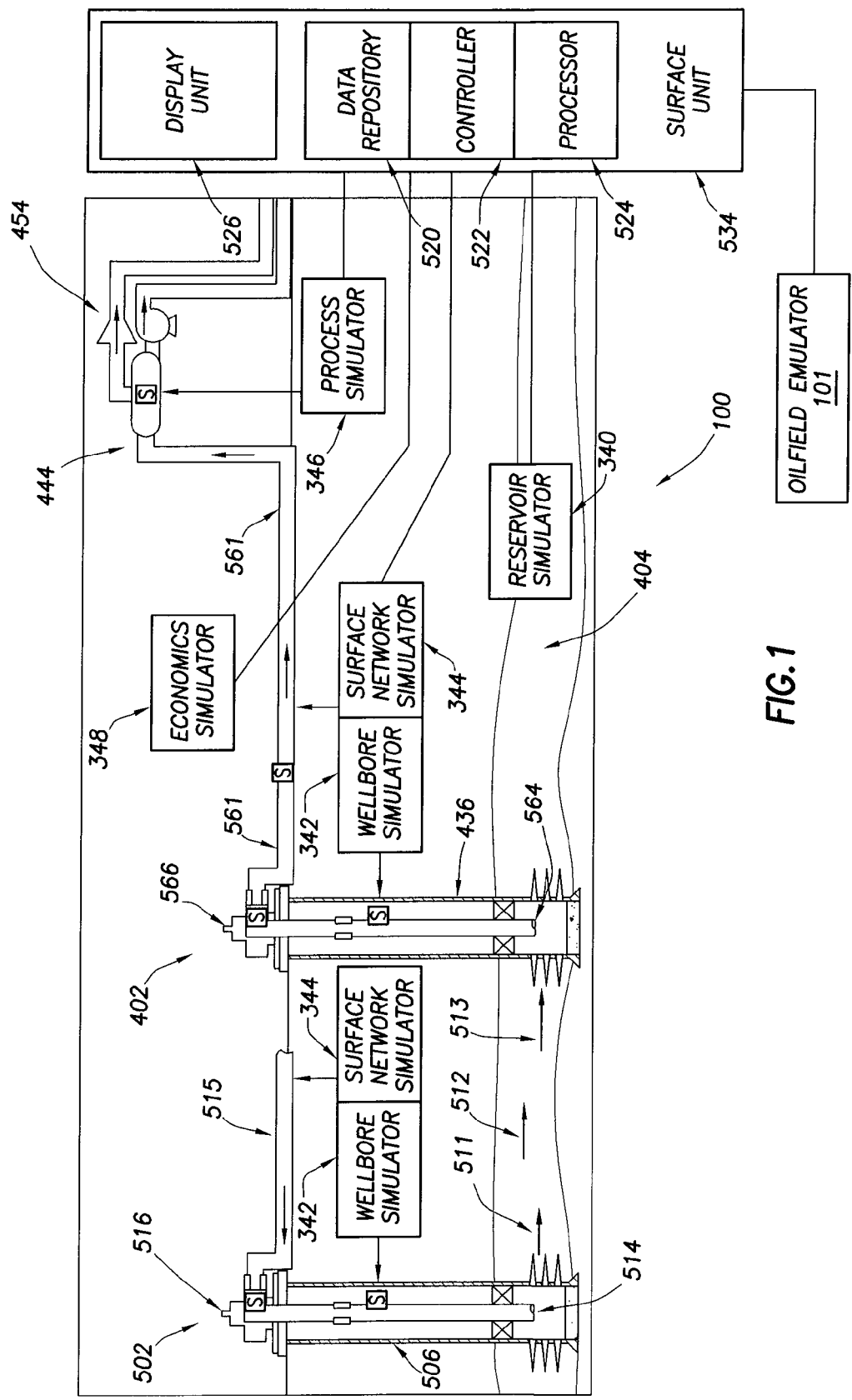
FIG. 1 shows an example schematic diagram of a portion of the oilfield depicting the simulation operation in accordance with one or more embodiments of the oilfield emulator.

Embodiments of the oilfield emulator are depicted in the above-identified figures and described in detail below. In describing the embodiments, like or identical reference numerals are used to identify common or similar elements. The figures are not necessarily to scale and certain features and certain views of the figures may be depicted exaggerated in scale or in schematic in the interest of clarity and conciseness.

FIG. 1 shows a schematic view of a portion of an oilfield (100), depicting the simulation operation, for example of a producing wellsite (402) and surface network (444) based on an oilfield emulator (101). The wellsite (402) of FIG. 1 has a wellbore (436) extending into the earth therebelow. In addition, FIG. 1 depicts an injection wellsite (502) having an injection wellbore (506). The injection wellsite (502) may be deployed in a gas lift operation. As depicted, the wellbores (436) and (506) has already been drilled, completed, and prepared for production from reservoir (404). In one or more embodiments, one or more of the modules shown in FIG. 1 may be omitted, repeated, and/or substituted. Accordingly, embodiments of the oilfield emulator should not be considered limited to the specific arrangements of modules shown in FIG. 1.

Wellbore production equipment (564) extends from a wellhead (566) of wellsite (402) and to the reservoir (404) to draw fluid (e.g., hydrocarbon) to the surface. The wellsite (402) is operatively connected to the surface network (444) via a transport line (561). Fluid flows from the reservoir (404), through the wellbore (436), and onto the surface network (444). The fluid then flows from the surface network (444) to the process facilities (454).

As described above, injected fluid may be injected through an injection wellbore, such as the wellbore (506) to gain additional amounts of hydrocarbon. Injected fluid may be injected to sweep hydrocarbons to producing wells and/or to maintain reservoir pressure by balancing extracted hydrocarbons with injected fluid. The wellbore (506) may be a new well drilled specifically to serve as an injection wellbore, or an already existing well that is no longer producing hydrocarbons economically. As depicted in FIG. 1, wellbore injection equipment (514) extends from a wellhead (516) of injection wellsite (502) to inject fluid (e.g., depicted as (511) and (512) in FIG. 1) in or around the periphery of the reservoir (404) to push hydrocarbons (e.g., depicted as (513) in FIG. 1) toward a producing wellbore, such as the wellbore (436). The injection wellsite (502) is operatively connected to the surface network (444) via an injection transport line (515), which provides the injection fluid to the injection wellsite (502) through the wellhead (516) and down through the well injection equipment (514).

The injected fluid may include water, steam, gas (e.g., carbon dioxide), a polymer, a surfactant, other suitable liquid, and/or any combinations thereof. One technique in fluid injection is gas lift operation, which involves the use of gases such as natural gas (i.e., naturally occurring mixture of hydrocarbon gases), carbon dioxide, or other suitable gases. The injected gas (e.g., natural gas, carbon dioxide, etc.) mixes with some of the remaining hydrocarbons in the reservoir, unlocks it from the pores, and pushes the fluid (e.g., depicted as (513) in FIG. 1) to producing wells. Water (e.g., depicted as (511) in FIG. 1) is often injected behind the gas (e.g., depicted as (512) in FIG. 1) to push the miscible gas and unlocked hydrocarbons along based on the incompressible nature of water.

The efficacy of the fluid injection in recovering remaining hydrocarbons from an oilfield depends on careful planning of the injection schedules such as the selection of fluid, the determination of the composition of the fluid to ensure the miscibility, the pumping rate, the switching cycles between different injected fluid, the controlled interface, and capillary forces between different injected fluid, etc. The fluid injection schedule may be determined considering geological and geophysical information, such as temperature, pressure, porosity, permeability, composition, etc. In addition to the complexity in determining fluid injection schedules, the source of the injection fluid, the constraints of the processing facilities and surface network, and market value of oil can all impact the overall performance of the oilfield operation.

An oilfield emulator (101) described below, can be used, for example, to model the fluid injection operation including various aspects of the oilfield, such as geological, geophysical, geoscience, operational, financial, etc. In the gas lift emulator, various constraints of the oilfield operation may be considered, such as the network constraints, the processing facility constraints, the fluid source constraints, the reservoir constraints, etc.

As further depicted in FIG. 1, sensors (S) are located about the oilfield (100) to monitor various parameters during oilfield operations. The sensors (S) may measure, for example, pressure, temperature, flow rate, composition, and other parameters of the reservoir, wellbore, surface network, process facilities and/or other portions of the oilfield operation. These sensors (S) are operatively connected to a surface unit (534) for collecting data therefrom. One or more surface units (534) may be located at the oilfield (100), or linked remotely thereto. The surface unit (534) may be a single unit, or a complex network of units used to perform the necessary modeling/planning/management functions (e.g., in fluid injection scheduling) throughout the oilfield (100). The surface unit (534) may be a manual or automatic system. The surface unit (534) may be operated and/or adjusted by a user. The surface unit (534) is adapted to receive and store data. The surface unit (534) may also be equipped to communicate with various oilfield equipment. The surface unit (534) may then send command signals to the oilfield in response to data received or modeling performed. For example, the fluid injection schedule may be adjusted and/or optimized based on modeling results updated according to changing parameters throughout the oilfield, such as geological parameters, geophysical parameters, geoscience parameters, network parameters, process facility parameters, injection fluid parameters, market parameters, financial parameters, etc.

As depicted in FIG. 1, the surface unit (534) has computer facilities, such as data repository (520), controller (522), processor (524), and display unit (526), for managing data. The data is collected in data repository (520), and processed by the processor (524) for analysis. Data may be collected from the oilfield sensors (S) and/or by other sources. For example, oilfield data may be supplemented by historical data collected from other operations, or user inputs.

The analyzed data (e.g., based on modeling performed) may then be used to make decisions. A transceiver (not depicted) may be provided to allow communications between the surface unit (534) and the oilfield (100). The controller (522) may be used to actuate mechanisms at the oilfield (100) via the transceiver based on these decisions. In this manner, the oilfield (100) may be selectively adjusted based on the data collected. These adjustments may be made automatically based on computer protocol and/or manually by an operator. In some cases, well plans are adjusted to select optimum operating conditions or to avoid problems.

To facilitate the processing and analysis of data, simulators may be used to process the data for modeling various aspects of the oilfield operation. Specific simulators are often used in connection with specific oilfield operations, such as reservoir or wellbore simulation. Data fed into the simulator(s) may be historical data, real time data or combinations thereof. Simulation through one or more of the simulators may be repeated or adjusted based on the data received.

As depicted, the oilfield operation is provided with wellsite and non-wellsite simulators. The wellsite simulators may include a reservoir simulator (340), a wellbore simulator (342), and a surface network simulator (344). The reservoir simulator (340) solves for hydrocarbon flow through the reservoir rock and into the wellbores. The wellbore simulator (342) and surface network simulator (344) solves for hydrocarbon flow through the wellbore and the surface network (444) of pipelines. As depicted, some of the simulators may be separate or combined, depending on the available systems.

The non-wellsite simulators may include both a process simulator (346) and an economics simulator (348). The processing unit has a process simulator (346). The process simulator (346) models the processing plant (e.g., the process facilities (454)) where the hydrocarbon(s) is/are separated into its constituent components (e.g., methane, ethane, propane, etc.) and prepared for sales. The oilfield (100) is provided with an economics simulator (348). The economics simulator (348) models the costs of part or all of the oilfield (100) throughout a portion or the entire duration of the oilfield operation. Various combinations of these and other oilfield simulators may be provided.

One of the most time consuming activities for the engineer is the capture and organization of modeling data (not shown) used by the simulators described above (e.g., the wellbore simulator (342) and/or surface network simulator (344)) to perform various simulations for the oilfield operations, for example to model the producing wellsite (402), injection wellsite (502), surface network (444), and other surface facilities. Traditionally, these modeling data are inputted into the simulators manually due to the lack of capabilities for automatic data capture of the commercially available simulators.

In one or more embodiments of the oilfield emulator (101), the modeling data may be collected from the oilfield (100), stored in the data repository (520), or generated by one or more simulators. The modeling data may include static pressure, gas/oil ration (GOR), water cut, well head pressure, gas lift injection flow rate, gas lift injection flow rate per well, choke diameter, separator pressure, minimum and maximum gas lift injection flow rate (for optimization process), total gas available (for optimization process), and other oilfield data required by the simulators. The modeling data may further include description of the well model (e.g., fluid type, user information and comments, etc.), inflow performance relationship (IPR) and pressure/volume/temperature (PVT) information, completion information, subsurface information and gas lift data, the last well test (connection to a data base), etc. In one or more embodiments of the oilfield emulator, the modeling data may be used for nodal analysis, diagnostic analysis, and optimization for lift resource allocation, among others.

As further depicted in FIG. 1, the oilfield emulator (101) is operatively linked to the surface unit (534). In one or more embodiments, the oilfield emulator (101) has the functionality to automatically load from the data repository (520) the well and facilities operation conditions as modeling data for the simulators. In one or more embodiments, the oilfield emulator (101) may also have the functionality to automatically load the interim simulation results from one or more simulators as modeling data for another simulator to reduce the analysis time. For example, the bottom hole operating point parameters generated in a nodal analysis may be loaded as inputs to the diagnostic analysis in the same simulation run without the need for manual data entry in two separate simulation runs.

In one or more embodiments, the oilfield emulator (101) may include simplified and user friendly interface to run simulations with different scenarios, store historical manual adjustments of modeling data as different scenarios, and store the historical results of simulations performed with different scenarios.

Figure 2:
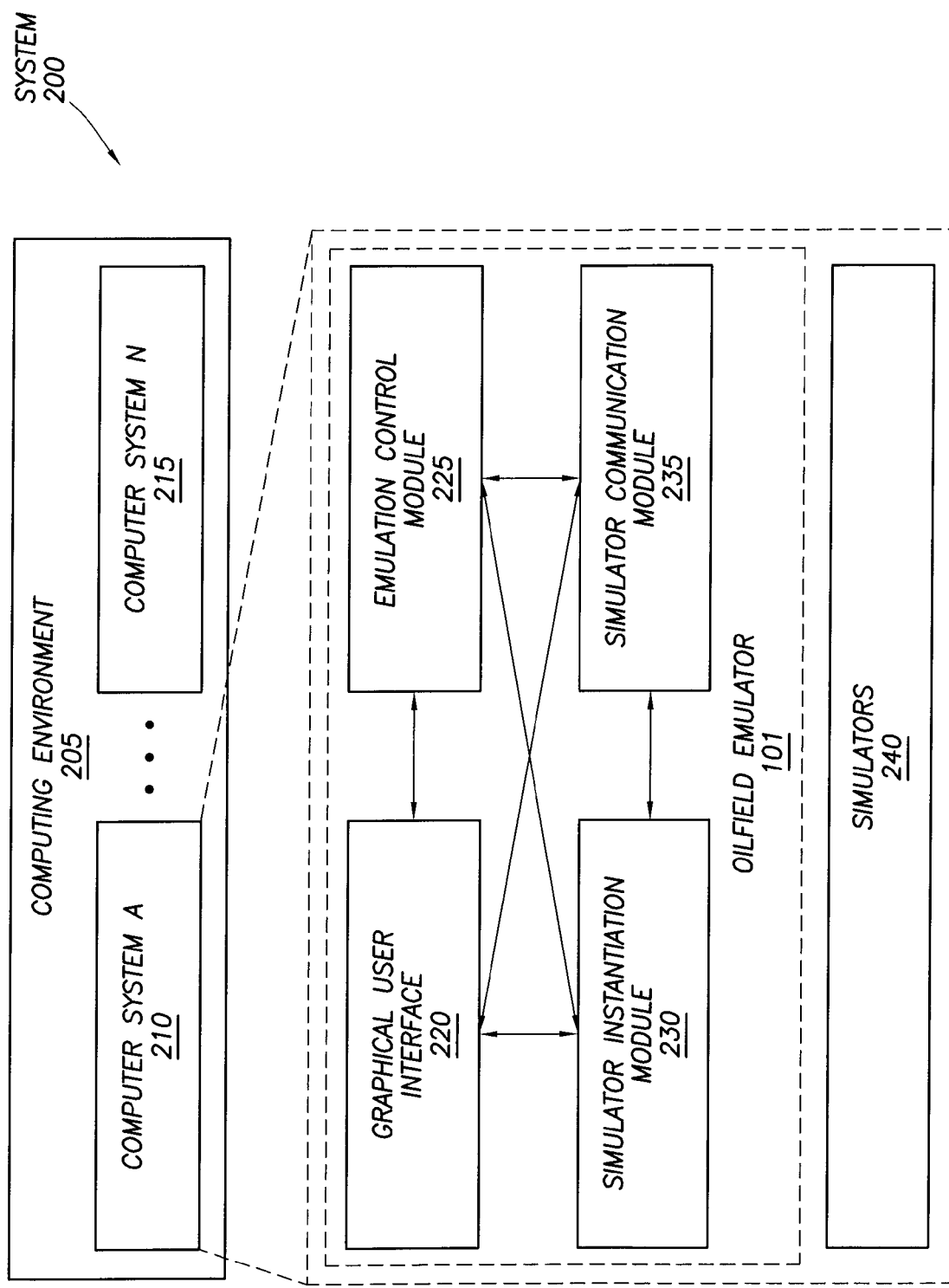
FIG. 2 shows an example diagram of a system in which one or more embodiments of the oilfield emulator can be implemented.

FIG. 2 shows a diagram of a system (200) in accordance with one or more embodiments of the oilfield emulator. Specifically, FIG. 2 shows a diagram of a computing environment (205) in accordance with one or more embodiments. In one or more embodiments, one or more of the modules shown in FIG. 2 may be omitted, repeated, and/or substituted. Accordingly, embodiments of the oilfield emulator (101 in FIG. 1) should not be considered limited to the specific arrangements of modules shown in FIG. 2. In one or more embodiments, the computing environment (205) may be implemented in one or more surface unit, such as the surface unit (534) described with respect to FIG. 1 above.

In one or more embodiments, the computing environment (205) may include one or more computer systems (e.g., computer system A (210), computer system N (215), etc.) configured to perform oilfield operations such as simulation-related tasks. In one or more embodiments of the oilfield emulator, the computer system(s) (e.g., 210, 215) may be web servers, embedded systems (e.g., a computer located in a downhole tool), desktop computers, laptop computers, personal digital assistants, any other similar type of computer system, or any combination thereof.

Specifically, in one or more embodiments, one or more of the computer systems (e.g., 210, 215) may include the oilfield emulator (101) and simulators (240) (e.g., any of the simulators described in FIG. 1 above). The oilfield emulator (101), as described in FIG. 1 above, is shown to include a graphical user interface (220), an emulation control module (225), a simulator instantiation module (230), a simulator communication module (235), and simulators (240). In one or more embodiments, the aforementioned components (i.e., 220, 225, 230, 235, 240) may be located in a single computer system (e.g., 210, 215), distributed across multiple computer systems (e.g., 210, 215), or any combination thereof. In one or more embodiments, each of the aforementioned components (i.e., 220, 225, 230, 235, 240) may include one or more software modules, one or more hardware modules, or any combination thereof. Further, in one or more embodiments, the aforementioned components (i.e., 220, 225, 230, 235, 240) may be configured to communicate with each other via function calls, application program interfaces (APIs), a network protocol (i.e., a wired or wireless network protocol), electronic circuitry, any other similar type of communication and/or communication protocol, or any combination thereof.

In one or more embodiments, the graphical user interface (220) may be configured as a gas lift emulator interface to perform the gas lift variable adjustment such as static pressure, GOR, water cut, well head pressure, gas lift injection flow rate, etc.

In one or more embodiments, the graphical user interface (220) may be configured as a gas lift optimization emulator interface to perform the gas lift variable adjustment such as gas lift injection flow rate per well, choke diameter, separator pressure, minimum and maximum gas lift injection flow rate for optimization process, total gas available for optimization process, etc.

In one or more embodiments, the emulation control module (225) may be configured to obtain user instructions from the graphical user interface (220) for performing various emulation functions by initiating corresponding emulation processes. In one or more embodiments, the emulation control module (225) may be configured to initiate emulation processes that perform execution of nodal analysis, result plotting for nodal analysis, execution of well diagnostic, result plotting for well diagnostic, sensitivities analysis and reports, surface network simulation, gas lift optimization, etc.

In one or more embodiments, the emulation control module (225) may be configured to obtain modeling data (e.g., static pressure, GOR, water cut, well head pressure, gas lift injection flow rate (per well), choke diameter, separator pressure, minimum and maximum gas lift injection flow rate, total gas available, etc.) from the graphical user interface (220) for one or more simulators instantiated for the emulation processes. In one or more embodiments, the emulation control module (225) may be configured to obtain modeling data (e.g., a production network model for the one or more simulators) from a data repository of the one or more of the computer systems (e.g., 210, 215) according to path information obtained from the graphical user interface (220). In one or more embodiments, the emulation control module (225) may be configured to pass modeling data (e.g., interim simulation results) among the one or more simulators. In one or more embodiments, the emulation control module (225) may be configured to adjust a portion of the modeling data (e.g., according to appropriate formats) before providing the adjusted modeling data to the one or more simulators.

In one or more embodiments, the simulator instantiation module (230) may be configured to automatically start a hidden instance of a simulator (e.g., one of simulators (240)), and/or load the appropriate oilfield model, depending on an emulation function selected by the user via the graphical user interface (220). In one or more embodiments, the simulator instantiation module (230) may be configured to determine the appropriate interface component, in the simulator communication module (235), to use in order to manipulate and interact with the instantiated simulator (i.e., the simulator instance), for example through the simulator APIs (not shown).

In one or more embodiments, the simulator communication module (235) may be configured to communicate with simulators (240) through one or more interface components, which manipulate the simulators (240), for example through the simulator APIs (not shown). In one or more embodiments, modeling data described above may be sent and received between the oilfield emulator (101) and the simulators (240) via the simulator communication module (235). In one or more embodiments, model information and result data from the simulators (240) may be retrieved via the simulator communication module (235) and shown in the graphical user interface (220).

As described above, the oilfield emulator (101) may be a gas lift emulator or a gas lift optimization emulator where the simulations may relate to flow rate estimation using well models and gas lift optimization. Accordingly, the oilfield emulator (101) provides a real interaction between the user and the simulator processes during simulations. The user may open any well model stored locally in his machine (e.g., a client computer in a networked environment of the surface units) or the data repository in the surface unit and modify input parameters, execute simulations, and/or check the results. All the results are stored in a historical register with the capability to retrieve the simulation at any time for further adjustment. Also the models adjusted with the gas lift emulator may replace the current model that is running in the server of the networked environment.

As described, the nodal analysis and the diagnostic analysis of gas lift operations may be performed using the oilfield emulator described with respect to FIGS. 1 and 2 above. Specifically, nodal analysis is the application of systems analysis to the complete well system from the outer boundary of the reservoir to the sand face, across the perforations and completion section to the tubing intake, up the tubing string including any restrictions and downhole safety valves, the surface choke, the flow line and separator. In one or more embodiments, the nodal analysis performed using the oilfield emulator may involve a combination of well inflow performance, downhole multipurpose flow conduit performance (vertical or directional conduit performance), and surface performance (including choke, horizontal or inclined flow performance and separator). In one or more embodiments, the well diagnostic analysis performed using the oilfield emulator determines the gas lift injection efficiency and the pressure gradient according to the operational conditions. More details of analyzing oilfield operations such as the nodal analysis and the diagnoistic analysis are described with respect to FIG. 3 below.

FIG. 3 is a flowchart depicting a method for performing the oilfield operation in accordance with one or more embodiments of the oilfield emulator. In one or more embodiments, one or more of the elements shown in FIG. 3 may be omitted, repeated, and/or performed in a different order. Accordingly, embodiments of the oilfield emulator should not be considered limited to the specific arrangements of elements shown in FIG. 3. The method as shown in FIG. 3 may be practiced using the system (200) described with respect to FIG. 2 above.

In 302, modeling data and user instructions may be received from a graphical user interface. In one or more embodiments, the modeling data may include any of static pressure, GOR, water cut, well head pressure, or gas lift injection flow rate for a gas lift operation of the oilfield while the graphical user interface may be a gas lift emulator interface. In one or more embodiments, the modeling data may include any of gas lift injection flow rate per well, choke diameter, separator pressure, minimum and maximum gas lift injection flow rate for optimization process, and total gas available for optimization process for a gas lift operation of the oilfield while the graphical user interface may be a gas lift optimization emulator interface. In one or more embodiments, the user instructions may include any of path information of an oilfield model, execution of nodal analysis, result plotting for nodal analysis, execution of well diagnostic, result plotting for well diagnostic, sensitivities analysis and reports, surface network simulation, and gas lift optimization.

In 304, at least a portion of the modeling data may be selectively adjusted to generate adjusted modeling data, for example, the modeling data may be adjusted based on appropriate formats for various simulators described with respect to FIG. 1 above.

In 306, an oilfield model may be obtained based on the user instructions, i.e., the path information of an oilfield model.

In 308, first and second simulator instances may be instantiated based on the user instructions for performing a simulation using the adjusted modeling data and the oilfield model. In one or more embodiments, a wellbore simulator may be instantiated for performing simulation (e.g., nodal analysis or diagnostic analysis) of the gas lift operation. In one or more embodiments, a network simulator may be instantiated for performing simulation (e.g., to allocate lift resources) of the gas lift optimization operation. In one or more embodiments, multiple simulations (e.g., nodal analysis and diagnostic analysis) may be performed concurrently using the first and second simulator instances.

In 310, interim simulation results may be passed between the first and second simulator instances for performing the simulation In one or more embodiments of the oilfield emulator, the bottom hole operating point parameters generated in a nodal analysis may be loaded as inputs to the diagnostic analysis in the same simulation run without the need for manual data entry in two separate simulation runs.

In 312, a result of the simulation may be displayed using the graphical user interface. In one or more embodiments, the simulation results may relate to the nodal analysis and/or the diagnostic analysis. More details of displaying simulation result using the graphical user interface are described in an example with respect to FIG. 4 below.

In 314, the oilfield operations (e.g., gas lift operation or gas lift optimization operation) may be performed based on the result of the simulation.

FIG. 4 shows an example screen shot (400) in accordance with one or more embodiments of the oilfield emulator. Key phrases in the screen shot have been translated into English shown in the annotation bubbles.

As shown in FIG. 4, the screen shot (400) is obtained from the gas lift emulator and is divided in three main sections (410-430). The section (410) shows a well diagram with variable values for executing the nodal analysis such as gas lift rate (BN), reservoir pressure (PWS), gas oil relation (RGA), and water cut. Each of these variables shows two values with values on the left side being the values used for the executed analysis and values on the right side being the new values for input to the emulator to execute a new analysis. In addition, the well to be analyzes may be selected from a list in a pull-down menu (411). Furthermore, command buttons are provided for executing the simulation, store simulation results, display historic simulation data, and display sensitivity curve (412).

Well head pressure, gas lift volume injection, reservoir pressure, gas oil ration (GOR), and water cut (WCUT).

Further as shown in FIG. 4, the section (420) shows the nodal analysis plot and related information where the inflow performance relationship (IPR) is shown as curve (422) and the production curve is shown as curve (421). The intersection point of these two curves represents the operational point. In addition, liquid, gas, and oil production rate, also are the calculated bottom Hole pressure (BHP) and the well head temperature (WHT) are shown (423) to the right of the IPR plot.

Further as shown in FIG. 4, the section (430) shows the well diagnostic analysis information. In section (430), the performance of the gas injection into the well is shown. The plot includes the tubing pressure gradient curve (431) and casing pressure gradient curve (432). The horizontal line (433) is the depth of the gas injection point. In one or more embodiments, this plot may be used to quickly evaluate if the injection point is too deep or too shallow and if the injection volume and injection pressure are sufficient to reach the injection point. In addition, the tubing head pressure, tubing head temperature, liquid rate, water cut, total gas rate, gas injection rate, casing head pressure, orifice diameter, and injection depth are shown as quick look input data (434) to the left of the plot.

Generally speaking, the described oilfield emulator provides for automatic data capture. Accordingly, by using the described oilfield emulator, an engineer is able to more efficiently capture and organize data in commercial wellbore and network simulators to improve performance of the different required simulations for gas lift wells and surface facilities, including diagnostic and optimization.

Figure 5:
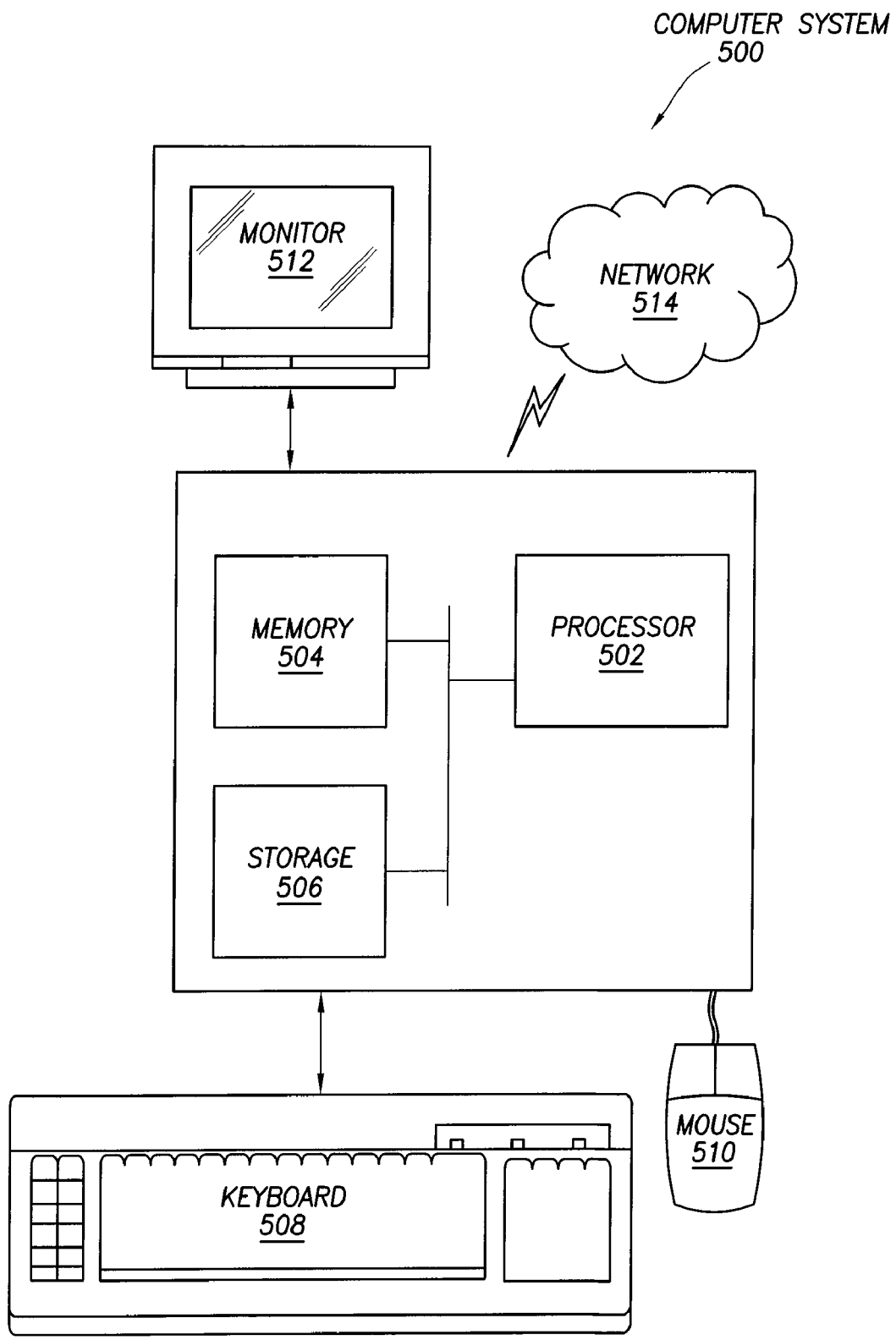
FIG. 5 shows a computer system in accordance with one or more embodiments of the oilfield emulator.

Embodiments of the oilfield emulator may be implemented on virtually any type of computer regardless of the platform being used. For example, as shown in FIG. 5, a computer system (500) includes one or more processor(s) (502), associated memory (504) (e.g., random access memory (RAM), cache memory, flash memory, etc.), a storage device (506) (e.g., a hard disk, an optical drive such as a compact disk drive or digital video disk (DVD) drive, a flash memory stick, etc.), and numerous other elements and functionalities typical of today's computers (not shown). The computer (500) may also include input means, such as a keyboard (508), a mouse (510), or a microphone (not shown). Further, the computer (500) may include output means, such as a monitor (512) (e.g., a liquid crystal display (LCD), a plasma display, or cathode ray tube (CRT) monitor). The computer system (500) may be connected to a network (not shown) (e.g., a local area network (LAN), a wide area network (WAN) such as the Internet, or any other similar type of network) with wired and/or wireless segments via a network interface connection (not shown). Those skilled in the art will appreciate that many different types of computer systems exist, and the aforementioned input and output means may take other forms. Generally speaking, the computer system (500) includes at least the minimal processing, input, and/or output means necessary to practice embodiments of the oilfield emulator.

Further, those skilled in the art will appreciate that one or more elements of the aforementioned computer system (500) may be located at a remote location and connected to the other elements over a network. Further, embodiments of the oilfield emulator may be implemented on a distributed system having a plurality of nodes, where each portion of the oilfield emulator may be located on a different node within the distributed system. In one embodiments of the oilfield emulator, the node corresponds to a computer system. Alternatively, the node may correspond to a processor with associated physical memory. The node may alternatively correspond to a processor with shared memory and/or resources. Further, software instructions for performing embodiments of the oilfield emulator may be stored on a computer readable medium such as a compact disc (CD), a diskette, a tape, or any other computer readable storage device.

It will be understood from the foregoing description that various modifications and changes may be made in the embodiments of the oilfield emulator without departing from its true spirit.

This description is intended for purposes of illustration only and should not be construed in a limiting sense. The scope of this oilfield emulator should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

While the oilfield emulator has been described with respect to a limited number of embodiments, those skilled in the art, having benefit of this disclosure, will appreciate that other embodiments can be devised which do not depart from the scope of the oilfield emulator as disclosed herein. Accordingly, the scope of the oilfield emulator should be limited only by the attached claims.

What is claimed is:

1. A method for performing oilfield operations for an oilfield, comprising:
    receiving modeling data and user instructions from a graphical user interface for performing an initial simulation of a gas lift operation of the oilfield, wherein the graphical user interface is configured to emulate the gas lift operation;
    selectively adjusting at least a portion of the modeling data to generate adjusted modeling data comprising a data item, wherein the data item is displayed in a first field in the graphical user interface, wherein the data item comprises a first value of a control parameter used in performing the initial simulation;
    obtaining an oilfield model based on the user instructions;
    instantiating first and second simulator instances based on the user instructions for performing the initial simulation using the adjusted modeling data and the oilfield model;
    passing interim simulation results between the first and second simulator instances for performing the initial simulation;
    displaying a result of the initial simulation using the graphical user interface, wherein the result is based at least on the first value of the control parameter and indicates an operating point of the gas lift operation;
    receiving, in response to displaying the result, a second value of the control parameter entered by the user into a second field disposed adjacent to the first field in the graphical user interface;
    performing a revised simulation using revised modeling data to generate a revision of the result, wherein the revised modeling data is generated from the adjusted modeling data by at least replacing the first value of the control parameter with the second value of the control parameter; and
    performing, in response to displaying the revision of the result, the gas lift operation based on the second value of the control parameter.

2. The method of claim 1, wherein the modeling data comprises at least one selected from a group consisting of static pressure, GOR, water cut, well head pressure, and gas lift injection flow rate.

3. The method of claim 1, wherein the graphical user interface is configured to emulate the gas lift operation by displaying the result as a composite plot showing a tubing pressure gradient curve, a casing pressure gradient curve, and an indicator representing a depth of gas injection point.

4. The method of claim 3, wherein the modeling data comprises at least one selected from a group consisting of gas lift injection flow rate per well, choke diameter, separator pressure, minimum and maximum gas lift injection flow rate for optimization process, and total gas available for optimization process.

5. The method of claim 1, wherein the user instructions comprise at least one selected from a group consisting of path information of an oilfield model, execution of nodal analysis, result plotting for nodal analysis, execution of well diagnostic, result plotting for well diagnostic, sensitivities analysis and reports, surface network simulation, and gas lift optimization.

6. The method of claim 1, wherein the initial simulation comprises a nodal analysis and a diagnostic analysis performed concurrently using the first and second simulator instances, respectively.

7. A computer readable medium storing instructions for performing oilfield operations for an oilfield, the instructions when executed by a processor comprising functionality for:
    receiving modeling data and user instructions from a graphical user interface for performing an initial simulation of a gas lift operation of the oilfield, wherein the graphical user interface is configured to emulate the gas lift operation;
    selectively adjusting at least a portion of the modeling data to generate adjusted modeling data comprising a data item, wherein the data item is displayed in a first field in the graphical user interface, wherein the data item comprises a first value of a control parameter used in performing the initial simulation;
    obtaining an oilfield model based on the user instructions;
    instantiating first and second simulator instances based on the user instructions for performing the initial simulation using the adjusted modeling data and the oilfield model;
    passing interim simulation results between the first and second simulator instances for performing the simulation;
    displaying a result of the initial simulation using the graphical user interface, wherein the result is based at least on the first value of the control parameter and indicates an operating point of the gas lift operation;
    receiving, in response to displaying the result, a second value of the control parameter entered by the user into a second field disposed adjacent to the first field in the graphical user interface;
    performing a revised simulation using revised modeling data to generate a revision of the result, wherein the revised modeling data is generated from the adjusted modeling data by at least replacing the first value of the control parameter with the second value of the control parameter; and
    performing, in response to displaying the revision of the result, the gas lift operation based on the second value of the control parameter.

8. The computer readable medium of claim 7, wherein the graphical user interface is configured to emulate the gas lift operation.

9. The computer readable medium of claim 8, wherein the modeling data comprises at least one selected from a group consisting of static pressure, GOR, water cut, well head pressure, and gas lift injection flow rate.

10. The computer readable medium of claim 7, wherein the graphical user interface is configured to emulate the gas lift operation by displaying the result as a composite plot showing a tubing pressure gradient curve, a casing pressure gradient curve, and an indicator representing a depth of gas injection point.

11. The computer readable medium of claim 10, wherein the modeling data comprises at least one selected from a group consisting of gas lift injection flow rate per well, choke diameter, separator pressure, minimum and maximum gas lift injection flow rate for optimization process, and total gas available for optimization process.

12. The computer readable medium of claim 7, wherein the user instructions comprises at least one selected from a group consisting of execution of nodal analysis, result plotting for nodal analysis, execution of well diagnostic, result plotting for well diagnostic, sensitivities analysis and reports, surface network simulation, and gas lift optimization.

13. The computer readable medium of claim 7, wherein the initial simulation comprises a nodal analysis and a diagnostic analysis performed concurrently using the first and second simulator instances, respectively.

14. A system for performing oilfield operations for an oilfield, comprising:
   a surface unit having a data repository for storing modeling data;
   a plurality of simulators operatively linked to the surface unit and configured to perform an initial simulation and a revised simulation of a gas lift operation of the oilfield, each oilfield simulator modeling at least a portion of the oilfield; and
   an oilfield emulator operatively linked to the surface unit, comprising:
      a graphical user interface configured for emulating the gas lift operation by:
         receiving the modeling data and user instructions for performing the initial simulation and the revised simulation;
         displaying a result of the initial simulation,
            wherein the result is based at least on a first value of a control parameter and indicates an operating point of the gas lift operation, and
            wherein the first value of the control parameter is contained in a data item displayed in a first field of the graphical user interface;
         receiving, in response to displaying the result, a second value of the control parameter, wherein the second value of the control parameter is entered by a user into a second field disposed adjacent to the first field in the graphical user interface; and
         displaying a revision of the result by the revised simulation;
      an emulation control module configured for:
         selectively adjusting at least a portion of the modeling data to generate adjusted modeling data comprising the data item having the first value of the control parameter;
         obtaining an oilfield model based on the user instructions;
         passing interim simulation results between first and second simulator instances for performing at least the initial simulation using the adjusted modeling data and the oilfield model; and
         initiating the revised simulation using revised modeling data to generate the revision of the result, wherein the revised modeling data is generated from the adjusted modeling data by at least replacing the first value of the control parameter with the second value of the control parameter;
      a simulator instantiation module configured for instantiating the first and second simulator instances based on the user instructions; and
      a simulator communication module configured for:
         sending the adjusted modeling data and the revised modeling data to the first and second simulator instances;
         receiving the result of the initial simulation and the revision of the result by the revised simulation from the first and second simulator instances; and
         sending and receiving the interim simulation results between first and second simulator instances,
      wherein the surface unit is configured to perform, in response to displaying the revision of the result, the gas lift operation based on the second value of the control parameter.

15. The system of claim 14, wherein the graphical user interface is configured to emulate the gas lift operation.

16. The system of claim 15, wherein the modeling data comprises at least one selected from a group consisting of static pressure, GOR, water cut, well head pressure, and gas lift injection flow rate.

17. The system of claim 14, wherein the graphical user interface is configured to emulate the gas lift operation by displaying the result as a composite plot showing a tubing pressure gradient curve, a casing pressure gradient curve, and an indicator representing a depth of gas injection point.

18. The system of claim 17, wherein the modeling data comprises at least one selected from a group consisting of gas lift injection flow rate per well, choke diameter, separator pressure, minimum and maximum gas lift injection flow rate for optimization process, and total gas available for optimization process.

19. The system of claim 14, wherein the user instructions comprise at least one selected from a group consisting of path information of an oilfield model, execution of nodal analysis, result plotting for nodal analysis, execution of well diagnostic, result plotting for well diagnostic, sensitivities analysis and reports, surface network simulation, and gas lift optimization.

20. The system of claim 14, wherein the simulation comprises a nodal analysis and a diagnostic analysis performed concurrently using the first and second simulator instances, respectively.

* * * * *